United States Patent
Ide et al.

(10) Patent No.: US 11,549,987 B2
(45) Date of Patent: Jan. 10, 2023

(54) STORAGE BATTERY MANAGEMENT DEVICE AND METHOD

(71) Applicants: KABUSHIKI KAISHA TOSHIBA, Tokyo (JP); Toshiba Energy Systems & Solutions Corporation, Kawasaki (JP)

(72) Inventors: Makoto Ide, Tokyo (JP); Masahiro Tohara, Tokyo (JP); Mami Mizutani, Tokyo (JP); Tomohiro Toyosaki, Tokyo (JP); Tsutomu Tanno, Tokyo (JP)

(73) Assignees: Kabushiki Kaisha Toshiba, Tokyo (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 17/272,285

(22) PCT Filed: Jan. 31, 2020

(86) PCT No.: PCT/JP2020/003756
§ 371 (c)(1),
(2) Date: Feb. 27, 2021

(87) PCT Pub. No.: WO2020/158932
PCT Pub. Date: Aug. 6, 2020

(65) Prior Publication Data
US 2021/0349149 A1  Nov. 11, 2021

(30) Foreign Application Priority Data

Feb. 1, 2019 (JP) .............................. JP2019-017474

(51) Int. Cl.
*G01R 31/367* (2019.01)
*G01R 31/389* (2019.01)
(Continued)

(52) U.S. Cl.
CPC ........ *G01R 31/367* (2019.01); *G01R 31/371* (2019.01); *G01R 31/389* (2019.01);
(Continued)

(58) Field of Classification Search
None
See application file for complete search history.

(56) References Cited

U.S. PATENT DOCUMENTS

2002/0109506 A1* 8/2002 Kawakami ........... G01R 31/392
 324/522
2004/0104728 A1* 6/2004 Bertness .............. G01R 31/385
 324/429
(Continued)

FOREIGN PATENT DOCUMENTS

JP  2013-187960 A  9/2013
JP  2014-196985 A  10/2014
(Continued)

OTHER PUBLICATIONS

International Search Report issued by the International Searching Authority in related PCT/JP2020/003756 Application dated Apr. 14, 2020 (2 pgs.).

*Primary Examiner* — Brent A. Fairbanks
(74) *Attorney, Agent, or Firm* — Finnegan, Henderson, Farabow, Garrett & Dunner, LLP (57) ABSTRACT

According to an embodiment, a storage battery management device includes: a memory configured to store therein storage battery characteristics of a storage battery unit as a storage battery characteristics table; and one or more processors coupled to the memory. The one or more processors are configured to: acquire the storage battery characteristics based on storage battery information output from the storage battery unit; update the storage battery characteristics table based on the acquired storage battery characteristics; and (Continued)

estimate SOC of the storage battery unit by referring to the updated storage battery characteristics table.

13 Claims, 11 Drawing Sheets

(51) Int. Cl.
    *G01R 31/392* (2019.01)
    *G01R 31/3842* (2019.01)
    *G01R 31/371* (2019.01)
    *H02J 7/00* (2006.01)
    *H01M 10/48* (2006.01)

(52) U.S. Cl.
    CPC ....... *G01R 31/3842* (2019.01); *G01R 31/392* (2019.01); *H01M 10/48* (2013.01); *H02J 7/0048* (2020.01)

(56) References Cited

U.S. PATENT DOCUMENTS

| | | | | |
|---|---|---|---|---|
| 2010/0072948 A1* | 3/2010 | Sun | .................. | G01R 31/367 320/134 |
| 2010/0244886 A1* | 9/2010 | Kawahara | .......... | G01R 31/3828 324/764.01 |
| 2010/0250163 A1* | 9/2010 | Maegawa | .......... | G01R 31/3842 702/63 |
| 2012/0049802 A1* | 3/2012 | Barsukov | ............. | G01R 31/367 320/136 |
| 2012/0274285 A1* | 11/2012 | Chawla | .................. | H01M 10/44 320/127 |
| 2012/0293131 A1* | 11/2012 | Nakamura | ............ | H01M 10/42 320/134 |
| 2012/0306450 A1* | 12/2012 | Nakayama | ........... | G01R 31/367 320/134 |
| 2014/0214347 A1 | 7/2014 | Laskowsky et al. | | |
| 2014/0354213 A1* | 12/2014 | Rivera-Poventud | ........................ | H02J 7/00712 320/107 |
| 2015/0276881 A1* | 10/2015 | Liu | ...................... | G01R 31/382 324/426 |
| 2015/0357852 A1* | 12/2015 | Nakao | ..................... | B60L 58/12 320/162 |
| 2016/0190658 A1* | 6/2016 | Ishibashi | ............... | H01M 10/48 324/432 |
| 2016/0327613 A1* | 11/2016 | Tenmyo | .............. | H02J 7/00712 |
| 2017/0254853 A1* | 9/2017 | Imamura | ............... | H01M 10/48 |
| 2019/0317152 A1* | 10/2019 | Ballantine | ........... | G01R 31/392 |
| 2021/0103001 A1* | 4/2021 | Seo | ....................... | G01R 31/392 |

FOREIGN PATENT DOCUMENTS

JP           5624333 B2     11/2014
JP       2016-114496 A     6/2016

\* cited by examiner

| OCV(V) | | TEMPERATURE(°C) | | | | | | | TB1 |
|---|---|---|---|---|---|---|---|---|---|
| | | ... | 20 | 21 | 22 | 23 | 24 | 25 | ... |
| SOC(%) | 0 | ... | AA | BA | CA | DA | EA | FA | ... |
| | 1 | ... | AB | BB | CB | DB | EB | FB | ... |
| | 2 | ... | AC | BC | CC | DC | EC | FC | ... |
| | ... | ... | ... | ... | ... | ... | ... | ... | ... |
| | 49 | ... | AD | BD | CD | DD | ED | FD | ... |
| | 50 | ... | AE | BE | CE | DE | EE | FE | ... |
| | 51 | ... | AF | BF | CF | DF | EF | FF | ... |
| | ... | ... | ... | ... | ... | ... | ... | ... | ... |
| | 98 | ... | AG | BG | CG | DG | EG | FG | ... |
| | 99 | ... | AH | BH | CH | DH | EH | FH | ... |
| | 100 | ... | AI | BI | CI | DI | EI | FI | ... |

FIG.12B

STORAGE BATTERY MANAGEMENT DEVICE AND METHOD

CROSS-REFERENCE TO RELATED APPLICATIONS

This application is a National Stage Application of International Application No. PCT/JP2020/003756, filed Jan. 31, 2020, which designates the United States, and which claims the benefit of priority from Japanese Application No. 2019-017474, filed on Feb. 1, 2019, the entire contents of both of which are incorporated herein by reference.

FIELD

Embodiments described herein relate generally to a storage battery management device and a method.

BACKGROUND

Introduction of storage battery systems for the purpose of fluctuation suppression in a power system has advanced. In such a storage battery system, long-term operation over 15 to 20 years and high operating rates are required.

However, temporal deterioration progress is inevitable in storage batteries, and hence storage battery characteristics tables (a state-of-charge (SOC) and temperature characteristics table of open circuit voltage (OCV) and an SOC and temperature characteristics table of internal resistance) used to estimate the state of charge (SOC) of a storage battery needs to be updated in accordance with deterioration.

DETAILED DESCRIPTION

According to an embodiment, a storage battery management device includes: a characteristics storage unit configured to store therein storage battery characteristics of a storage battery unit as a storage battery characteristics table; a characteristics acquisition unit configured to acquire the storage battery characteristics based on storage battery information output from the storage battery unit; a characteristics update unit configured to update the storage battery characteristics table based on the acquired storage battery characteristics; and an estimation unit configured to estimate SOC of the storage battery unit by referring to the updated storage battery characteristics table.

Next, embodiments of the present invention are described in detail with reference to the drawings.

Figure 1:
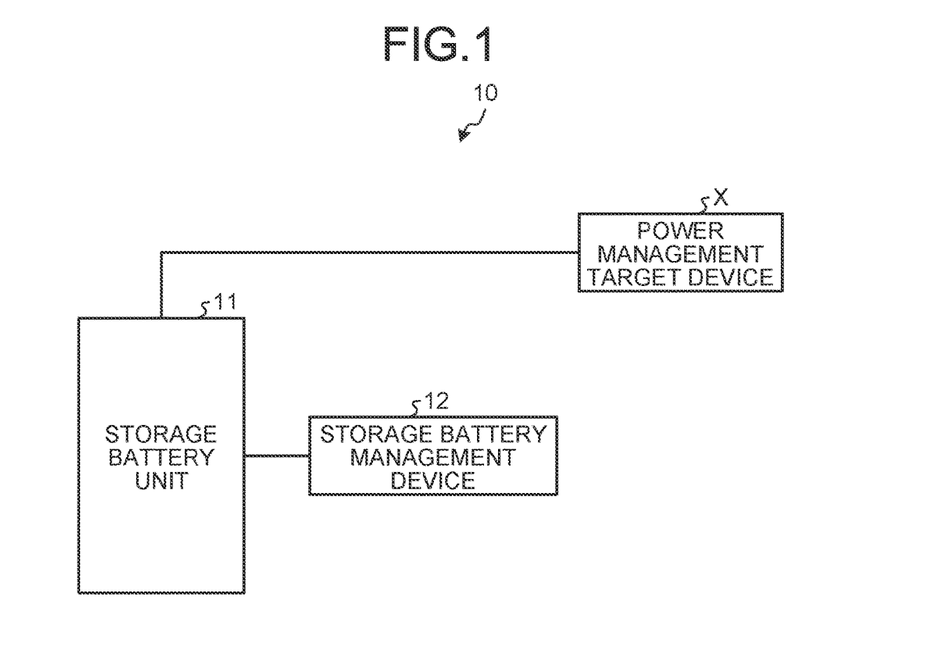
FIG. 1 is a schematic configuration block diagram of a storage battery system in an embodiment.

FIG. 1 is a schematic configuration block diagram of a storage battery system in an embodiment.

A storage battery system 10 roughly includes a storage battery unit 11 that includes a plurality of storage battery modules and supplies power to a power management target device X functioning as a load or stores power or supplies power to a power management target device X functioning as a power source or a load, and a storage battery management device 12 for managing the storage battery unit 11.

[1] First Embodiment

Figure 2:
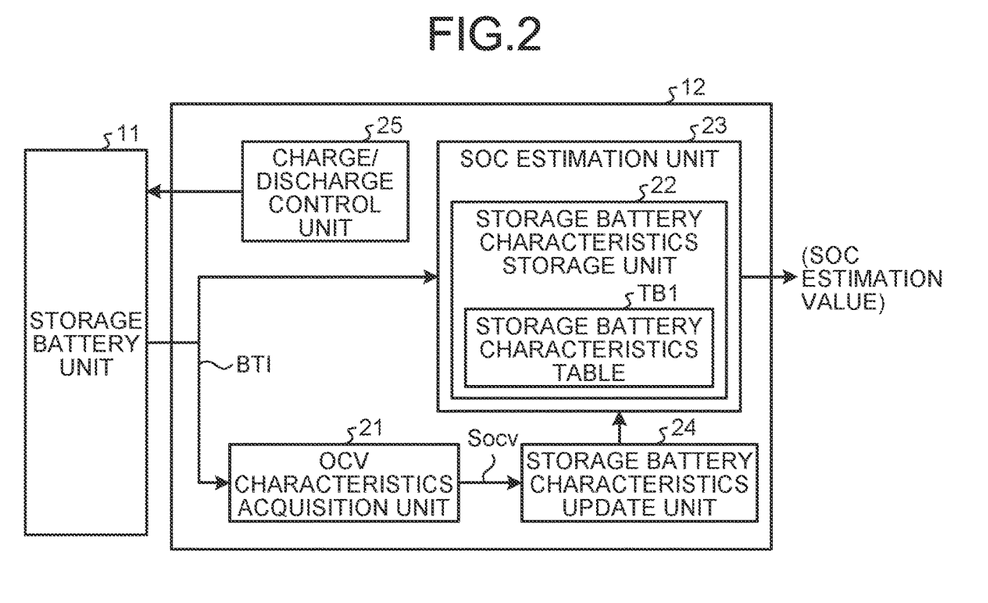
FIG. 2 is a main schematic configuration block diagram of a storage battery system in a first embodiment.

FIG. 2 is a main schematic configuration block diagram of the storage battery system in a first embodiment.

The storage battery management device 12 includes an OCV characteristics acquisition unit 21 that functions as a characteristics acquisition unit and acquires open circuit voltage (OCV) characteristics Socv based on storage battery information (such as current, voltage, and temperature) acquired from the storage battery unit 11, an SOC estimation unit 23 that has a storage battery characteristics storage unit 22 functioning as a characteristics storage unit for storing therein a storage battery characteristics table described later corresponding to storage battery characteristics of the storage battery unit 11, and functions as an estimation unit for estimating the state of charge (SOC) of the storage battery unit by referring to the storage battery characteristics storage unit 22 based on storage battery information BTI such as current information, voltage information, and temperature information acquired from the storage battery unit 11, a storage battery characteristics update unit 24 that functions as a characteristics update unit and updates a storage battery characteristics table TB1 stored in the storage battery characteristics storage unit 22 based on the OCV characteristics Socv acquired by the OCV characteristics acquisition unit 21, and a charge/discharge control unit 25 for controlling charge/discharge of the storage battery unit 11.

Figure 3:
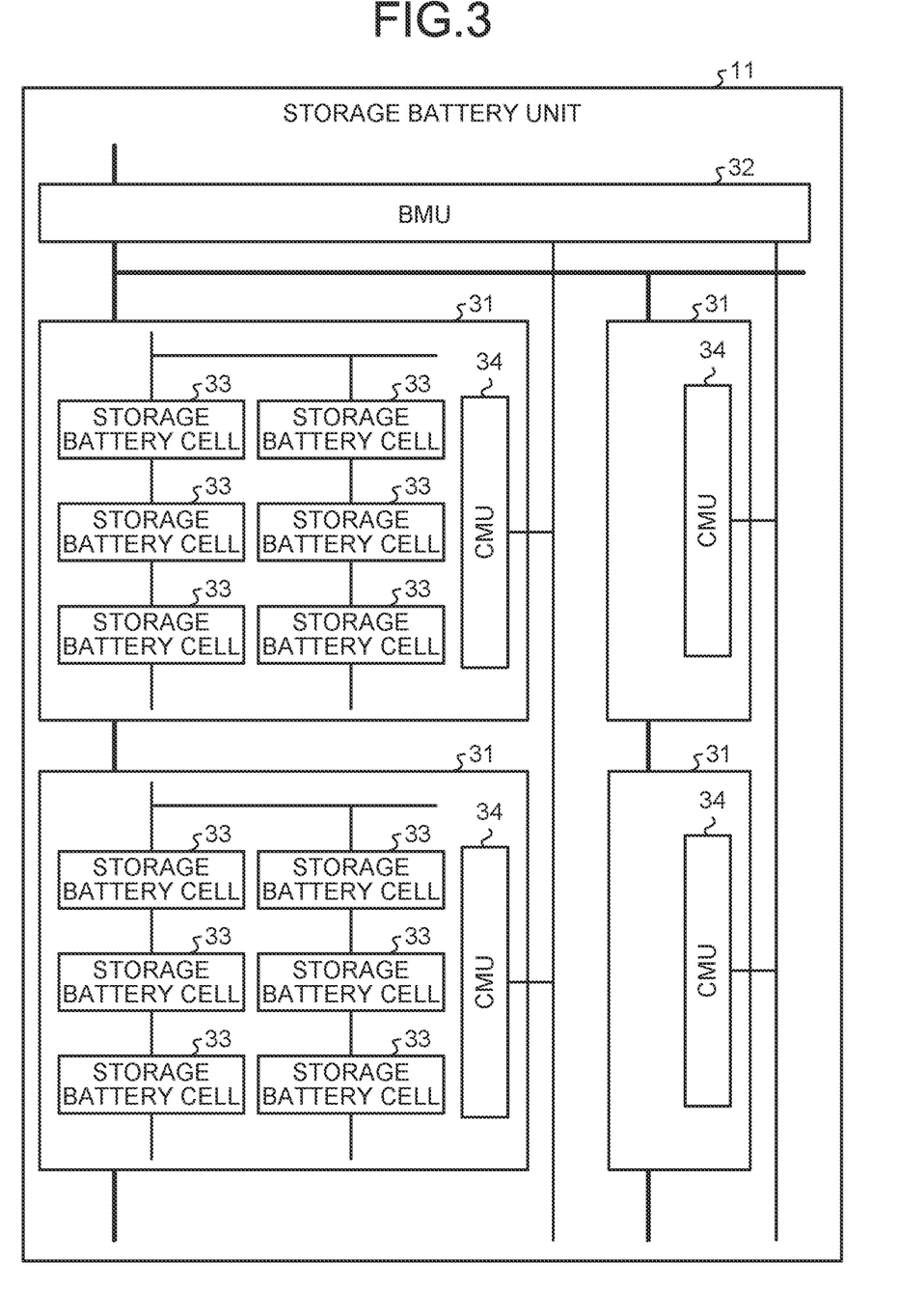
FIG. 3 is a schematic configuration block diagram of a storage battery unit 11.

FIG. 3 is a schematic configuration block diagram of the storage battery unit 11.

The storage battery unit 11 includes a plurality of storage battery modules 31 connected in series and in parallel, and a battery management unit (BMU) 32 for controlling the storage battery modules 31.

Each storage battery module 31 includes a plurality of storage battery cells 33 connected in series and in parallel, and a cell monitoring unit (CMU) 34 for monitoring temperature and voltage of each storage battery cell 33.

In the configuration of the storage battery system 10, the OCV characteristics Socv refer to characteristics of OCV with respect to SOC and temperature.

Figure 4:
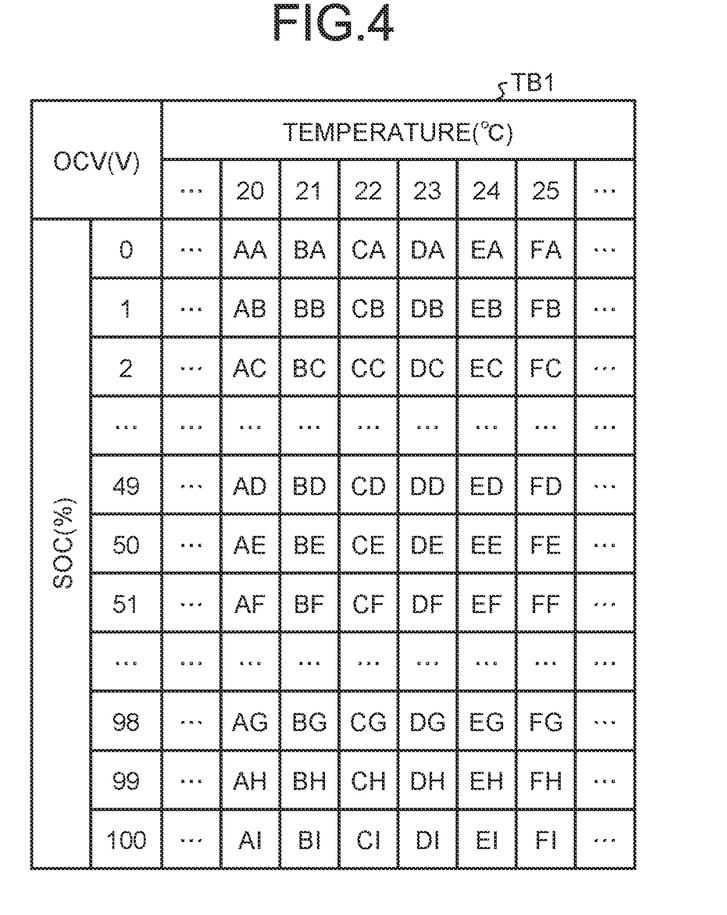
FIG. 4 is an explanatory diagram of an example of an OCV characteristics table as a storage battery characteristics table.

FIG. 4 is an explanatory diagram of an example of an OCV characteristics table as a storage battery characteristics table.

In the OCV characteristics table as the storage battery characteristics table TB1, values of OCV corresponding to a combination of temperature and SOC of the storage battery unit 11 are described.

In FIG. 4, AA, AB, ..., FH, FI indicate values of OCV.

For example, the value of OCV at a temperature of 21 degrees when SOC=50% is "BE".

Thus, by referring to the OCV characteristics table, an SOC estimation value can be acquired based on the temperature of the storage battery unit 11 and the value of OCV acquired from storage battery information.

Specifically, in the case of the example in FIG. 3, it is understood that when the temperature of the storage battery unit 11 is 22° C. and the acquired value of OCV is "CD", an SOC estimation value is 49% based on the storage battery characteristics table TB1 in FIG. 4. It is understood that when the temperature of the storage battery unit 11 is 24° C. and the acquired value of OCV is "EH", an SOC estimation value is 99%.

Next, the updating of OCV characteristics is described.

To acquire OCV characteristics and full charge capacity, it is desired to determine the OCV characteristics and full charge capacity by actual measurement.

Thus, the OCV characteristics acquisition unit 21 acquires OCV characteristics and full charge capacity with respect to SOC change from the storage battery information BTI output from the storage battery unit 11 at the time of charge/discharge.

In the following description, it is desired that the temperature of the storage battery unit 11 be substantially constant in a period for acquiring (measuring) OCV characteristics and full charge capacity with respect to SOC change, and the OCV characteristics and full charge capacity are acquired based on an instruction from the charge/discharge control unit 25. In the initial state, the storage battery unit 11 is in a completely discharged state (state that has reached discharge cut-off voltage).

First, the charge/discharge control unit 25 charges the storage battery unit 11 from the completely discharged state to the fully charged state (state that has reached charge cut-off voltage).

In the charge period from the completely discharged state to the fully charged state, the OCV characteristics acquisition unit 21 acquires charge voltage characteristics (charge SOC-closed circuit voltage characteristics) and full charge capacity.

The OCV characteristics acquisition unit 21 determines the state that has reached the charge cut-off voltage as the state of SOC 100% at that time point (measurement time point) from the voltage information included in the storage battery information BTI.

Next, the charge/discharge control unit 25 discharges the storage battery unit 11 from the fully charged state to the completely discharged state.

In the discharge period from the fully charged state to the completely discharged state, the OCV characteristics acquisition unit 21 acquires discharge voltage characteristics (discharge SOC-closed circuit voltage characteristics).

The OCV characteristics acquisition unit 21 determines the state that has reached the discharge cut-off voltage as the state of SOC 0% at that time point (measurement time point) from the voltage information included in the storage battery information BTI.

Subsequently, the OCV characteristics acquisition unit 21 estimates OCV characteristics based on temperature at the time when the discharge voltage characteristics are acquired and the charge voltage characteristics and discharge voltage characteristics. Specifically, OCV characteristics are estimated by calculating average values of charge voltage and discharge voltage in the same capacity to acquire OCV characteristics at the temperature at the time of the acquisition.

Consequently, the storage battery characteristics update unit 24 updates the storage battery characteristics table TB1 stored in the storage battery characteristics storage unit 22 based on the OCV characteristics acquired by the OCV characteristics acquisition unit 21.

In this case, the storage battery characteristics update unit 24 can update a part of the storage battery characteristics table TB1 at a temperature near the temperature of the storage battery unit 11 at the time of acquiring the OCV characteristics (that is, temperature range in which influence of temperature change is supposed to be the same, for example, when temperature at the time of updating is 23° C., 23±2° C.=21° C. to 25° C.). The entire storage battery characteristics table TB1 may be updated based on change in OCV characteristics before and after update stored in the storage battery characteristics storage unit 22 at a temperature of the storage battery unit 11 at the time of acquiring the OCV characteristics.

As a result, the SOC estimation unit 23 estimates SOC by using the storage battery information BTI output from the storage battery unit 11 and the updated storage battery characteristics table TB1 stored in the storage battery characteristics storage unit 22.

Examples of the method for estimating SOC include inputting storage battery information to a storage battery model using the storage battery characteristics table TB1 and estimating SOC by using OCV and internal resistance corresponding to voltage at that time point.

Thus, according to the first embodiment, the storage battery characteristics update unit 24 can update, based on the present OCV characteristics acquired by the OCV characteristics acquisition unit 21 and the initial storage battery characteristics table stored in the storage battery characteristics storage unit 22, the storage battery characteristics table TB1 at that time point to suppress the influence of deterioration of the storage battery cell 33.

As described above, according to the first embodiment, the OCV characteristics table is updated based on OCV characteristics at the present specific temperature, and by referring to the updated latest OCV characteristics table, SOC can be accurately estimated even if the storage battery cell 33 deteriorates, and more precise operation of the storage battery system 10 can be performed.

[2] Second Embodiment

Next, a second embodiment is described.

The configuration of a storage battery system in the second embodiment is the same as in the first embodiment, and hence description is given with reference to FIG. 1 again.

Figure 5:
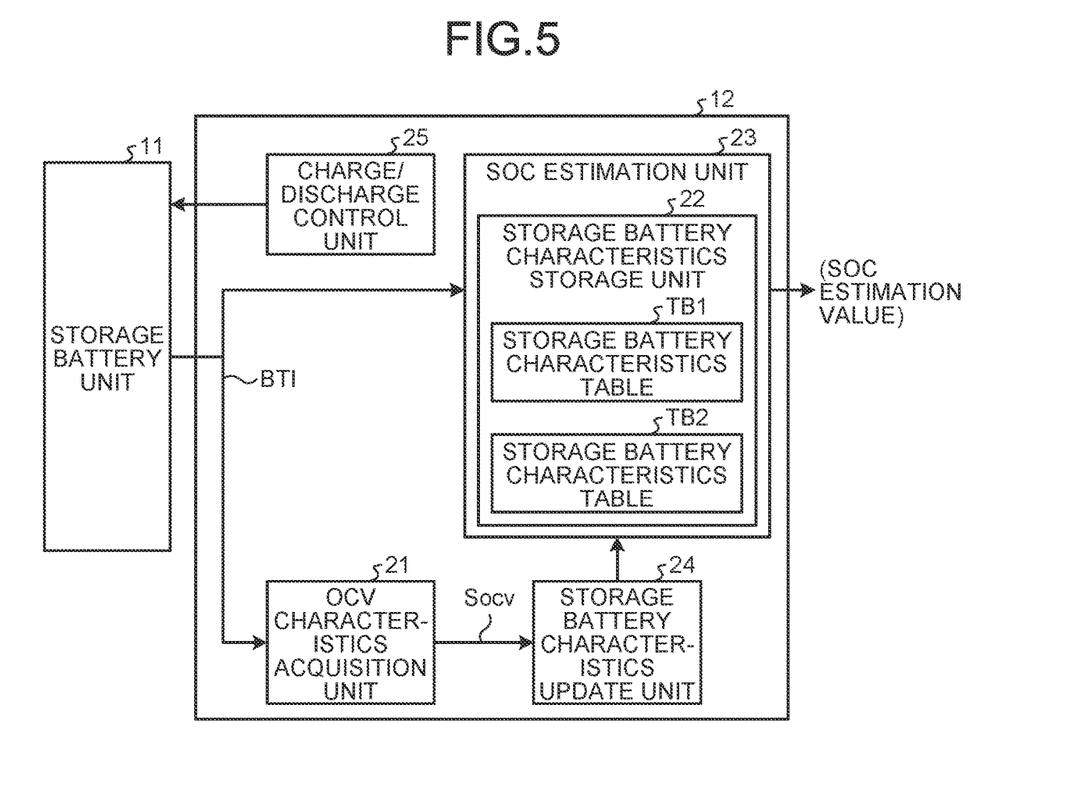
FIG. 5 is a schematic configuration block diagram of a storage battery system in a second embodiment.

FIG. 5 is a schematic configuration block diagram of the storage battery system in the second embodiment.

The second embodiment is different from the first embodiment in that an internal resistance characteristics table is stored in the storage battery characteristics storage unit 22 as a storage battery characteristics table TB2, and the storage battery characteristics update unit 24 updates the storage battery characteristics table (internal resistance characteristics table) TB2 in accordance with the actual SOC.

Next, operation in the second embodiment is described.

For example, the OCV characteristics acquisition unit 21 charges the storage battery unit 11 from the completely discharged state (state that has reached discharge cut-off voltage) to the fully charged state (state that has reached charge cut-off voltage) in the initial state in which storage battery cells 33 constituting the storage battery unit 11 are not deteriorated to acquire charge voltage characteristics (charge SOC-closed circuit voltage characteristics) and full charge capacity, and determines the state that has reached the charge cut-off voltage as the state of SOC 100% at that time point (measurement time point). The OCV characteristics acquisition unit 21 further acquires discharge voltage characteristics (discharge SOC-closed circuit voltage characteristics) by discharging from the fully charged state to the completely discharged state, and determines that the state that has reached the discharge cut-off voltage is the state of SOC 0% at that time point (measurement time point).

When it is assumed that charge capacity (full charge capacity) that has reached the charge cut-off voltage in the above-mentioned initial state is 200 Ah (=SOC100%: charge capacity in initial state), it is assumed that charge capacity that has reached the charge cut-off voltage at a measurement time point, that is, the charge capacity at the measurement time point is 120 Ah.

Thus, the charge capacity at the measurement time point is 120/200=60[%] of the charge capacity in the initial state.

Accordingly, in the second embodiment, the storage battery characteristics table (internal resistance characteristics table) TB2 is updated by regarding SOC as changing from 0 to 100% with respect to a change width of SOC of 60%, which is 60% of SOC marks of 0% to 100% in the initial storage battery characteristics table (internal resistance characteristics table) TB2.

The reason why the storage battery characteristics table (internal resistance characteristics table) TB2 is updated in the above-mentioned manner is that full charge capacity decreases because internal resistance increases as a whole and a voltage change amount caused by internal resistance on a charge end side and a discharge end side abruptly increases, with the result that both end portions (SOC 0% side and SOC 100% side), which can be used at the initial SOC, cannot be used and the effective available range of the storage battery unit 11 becomes narrower.

Figure 6:
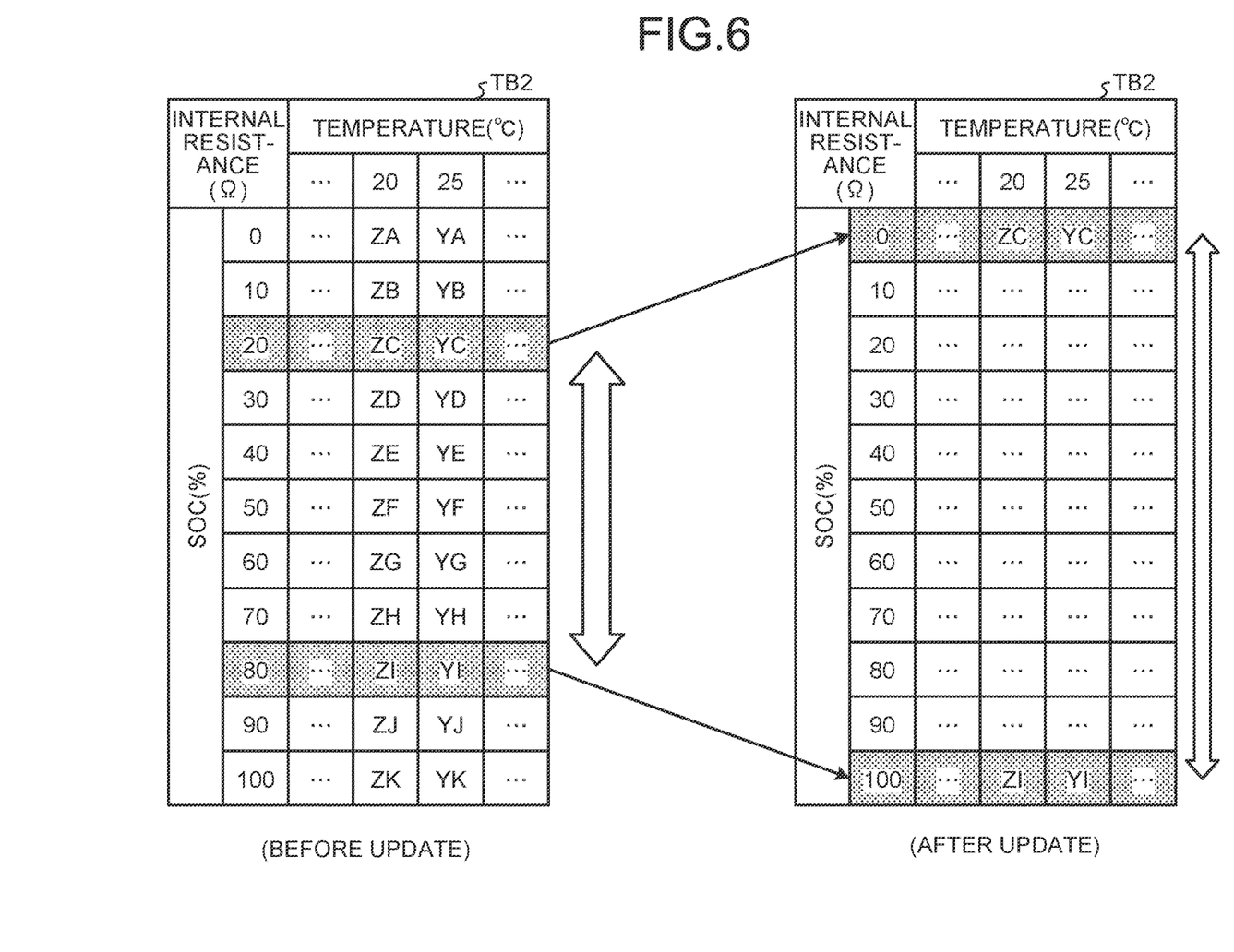
FIG. 6 is an explanatory diagram of an update example of an internal resistance characteristics table as a storage battery characteristics table.

FIG. 6 is an explanatory diagram of an update example of the internal resistance characteristics table as a storage battery characteristics table.

In the case of the example in FIG. 6, with reference SOC=50%, the range of SOC=20% to 80%(=50±30%) in the initial internal resistance characteristics table is distributed to SOC=0% to 100%.

More specifically, when temperature=20° C., an internal resistance value ZC(ω) at SOC=20% is set to SOC=0%, and an internal resistance value ZI at SOC=80% is set to SOC=100%.

Then, interpolation (or extrapolation) may be performed by using the internal resistance values ZC(ω) to ZI(ω) at a temperature of 20° C. corresponding to SOC=20% to 100% in the initial storage battery characteristics table (internal resistance characteristics table) TB2 illustrated in the left part of FIG. 6, and the internal resistance values of SOC=10, 20, . . . , 80, 90% in the present internal resistance characteristics table may be calculated to update the storage battery characteristics table (internal resistance characteristics table) TB2 as illustrated in the right part of FIG. 6.

In this case, the available range of SOC is different depending on how the present OCV characteristics changes from the initial OCV characteristics, and hence the manner of distribution of the available range of SOC may be adjusted by comparing the present OCV characteristics and the initial OCV characteristics.

Specifically, when the available range of the present OCV characteristics is shifted to the high SOC side as compared with initial OCV characteristics, SOC of 50% or more may be distributed as a reference (center position).

Specifically, for example, by setting reference SOC=60%, SOC=30% to 90%(=60±30%) of initial OCV characteristics may be distributed to SOC=0% to 100%.

When the available range of the present OCV characteristics is shifted to the low SOC side as compared with the initial OCV characteristics, a predetermined SOC of less than 50% may be distributed as a reference (center position) SOC.

Specifically, for example, by setting reference SOC=45%, SOC=15% to 75%(=45%±30%) of initial OCV characteristics may be distributed to SOC=0% to 100%.

As described above, according to the second embodiment, the storage battery characteristics table (internal resistance characteristics table) TB2 is updated based on the present OCV characteristics and full charge capacity, and SOC is estimated by using temperature and internal resistance as parameters in the updated storage battery characteristics table TB2. Consequently, SOC can be more accurately estimated even if the storage battery cell 33 deteriorates.

[3] Third Embodiment

Next, a third embodiment is described.

In the above-mentioned second embodiment, the SOC range is updated when updating the storage battery characteristics table TB2 as an internal resistance characteristics table, and the internal resistance value in the initial state is directly used, but a third embodiment is an embodiment in which an actually measured or estimated internal resistance value is used to further correct the storage battery characteristics table (internal resistance characteristics table) TB2.

Figure 7:
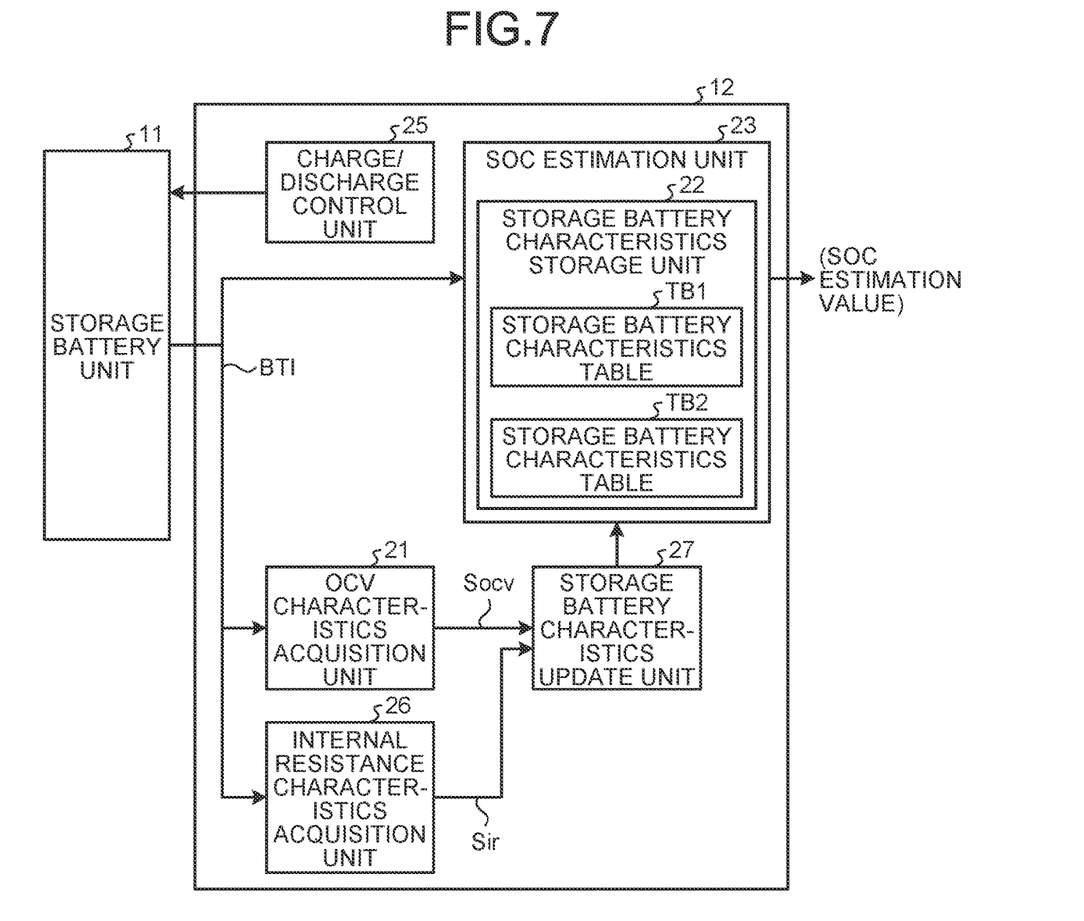
FIG. 7 is a main schematic configuration block diagram of a storage battery system in a third embodiment.

FIG. 7 is a main schematic configuration block diagram of a storage battery system in the third embodiment.

In FIG. 7, the same parts as in the second embodiment in FIG. 5 are denoted by the same reference symbols.

The third embodiment is different from the second embodiment in that the storage battery system includes an internal resistance characteristics acquisition unit 26 that functions as a characteristics acquisition unit and acquires present internal resistance characteristics Sir from storage battery information BTI such as current information, voltage information, and temperature information output from the storage battery unit 11, and a storage battery characteristics update unit 27 that functions as a characteristics update unit, calculates a correction coefficient from the relation between the acquired internal resistance characteristics Sir and the initial value of internal resistance characteristics, and updates the internal resistance characteristics table TB2.

In the above-mentioned configuration, the internal resistance characteristics acquisition unit 26 acquires or estimates the present internal resistance characteristics Sir from the storage battery information BTI output from the storage battery system. The internal resistance characteristics as used herein refer to characteristics of internal resistance with respect to SOC and temperature.

As a method for acquiring the present internal resistance characteristics Sir, a method for actually measuring the present internal resistance characteristics Sir is desired. However, in an actual system in operation, it is difficult to acquire temperature characteristics of internal resistance in the entire range of storage battery use temperature. Thus, herein, an internal resistance value at a freely selected SOC and temperature is acquired as the present internal resistance characteristics Sir. Note that, when the actual measurement is difficult due to system or operational constraints, the present internal resistance characteristics Sir may be determined by estimation.

The storage battery characteristics update unit 27 first updates the storage battery characteristics table (OCV characteristics table) TB1 and the storage battery characteristics table (internal resistance characteristics table) TB2 stored in the storage battery characteristics storage unit 22 based on the present OCV characteristics and the full charge capacity acquired from the OCV characteristics acquisition unit 21.

Next, the storage battery characteristics update unit 27 calculates the ratio of the internal resistance with its initial value at a freely selected SOC and temperature Temp acquired from the internal resistance characteristics acquisition unit 26 as a correction coefficient α.

In general, the internal resistance increases when the storage battery deteriorates, and hence the correction coefficient α, which is the ratio with the initial value is a value of 1 or more.

By multiplying the correction coefficient α with all values in the updated storage battery characteristics table (internal resistance characteristics table) TB2 obtained by the same method as in the second embodiment, the storage battery characteristics table (internal resistance characteristics table) TB2 stored in the storage battery characteristics storage unit 22 is finally updated.

More specifically, when the correction coefficient is represented by α and the initial internal resistance is represented by RBOL(SOC,Temp), an updated internal resistance RMOL(SOC,Temp) can be calculated by the following equation.

$$RMOL(SOC,Temp) = \alpha \times RBOL(SOC,Temp)$$

As described above, according to the third embodiment, the storage battery characteristics table (OCV characteristics table) TB1 and the storage battery characteristics table (internal resistance characteristics table) TB2 are updated based on the present OCV characteristics, full charge capacity, and internal resistance characteristics, and by using these characteristics, SOC can be more accurately estimated even if the storage battery deteriorates.

[4] Fourth Embodiment

In each of the above-mentioned embodiments, the updating of a storage battery characteristics table is not limited, but a fourth embodiment is an embodiment in which the updating of the storage battery characteristics table is limited.

Figure 8:
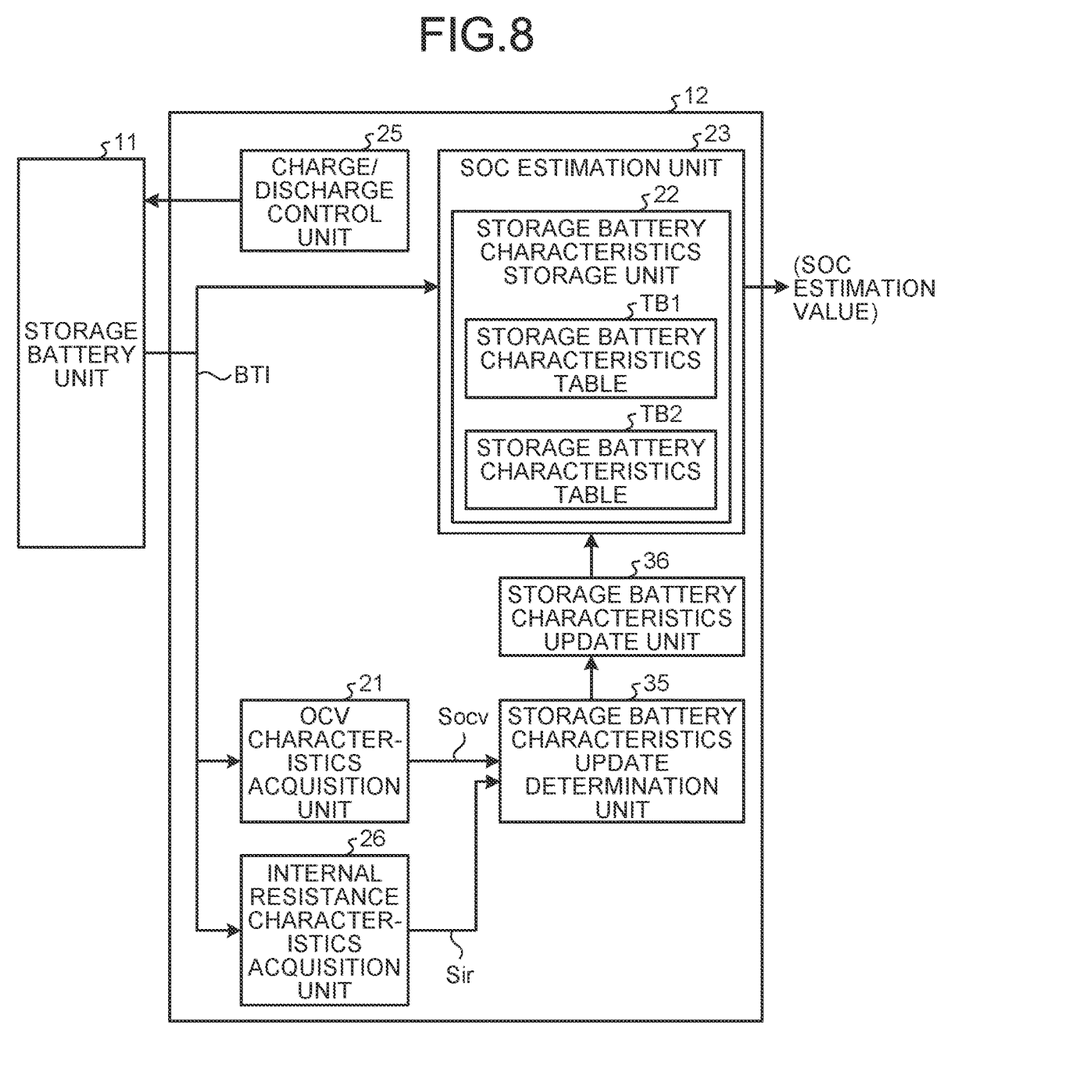
FIG. 8 is a main schematic configuration block diagram of a storage battery system in a fourth embodiment.

FIG. 8 is a main schematic configuration block diagram of a storage battery system in the fourth embodiment.

The fourth embodiment is different from the third embodiment illustrated in FIG. 7 that the storage battery system includes a storage battery characteristics update determination unit 35 for comparing the present storage battery characteristics Sir including full charge capacity, which is acquired from the OCV characteristics acquisition unit 21 and the internal resistance characteristics acquisition unit 26, with the storage battery characteristics table (OCV characteristics table) TB1 and the storage battery characteristics table (internal resistance characteristics table) TB2 stored in the storage battery characteristics storage unit 22, and determining whether a change amount thereof deviates from an allowable range, and a storage battery characteristics update unit 36 that functions as a characteristics update unit and updates the storage battery characteristics tables TB1 and TB2 when the change amount deviates from the allowable range based on the determination result of the storage battery characteristics update determination unit 35.

When the present full charge capacity is smaller than a prescribed threshold, the storage battery characteristics update determination unit 35 determines that a change amount of storage battery characteristics with respect to the storage battery characteristics tables TB1 and TB2 stored in the storage battery characteristics storage unit 22 deviates from an allowable range, and the storage battery characteristics tables TB1 and TB2 are updated by the storage battery characteristics update unit 36.

Next, operation in the fourth embodiment is described in more detail.

Figure 9:
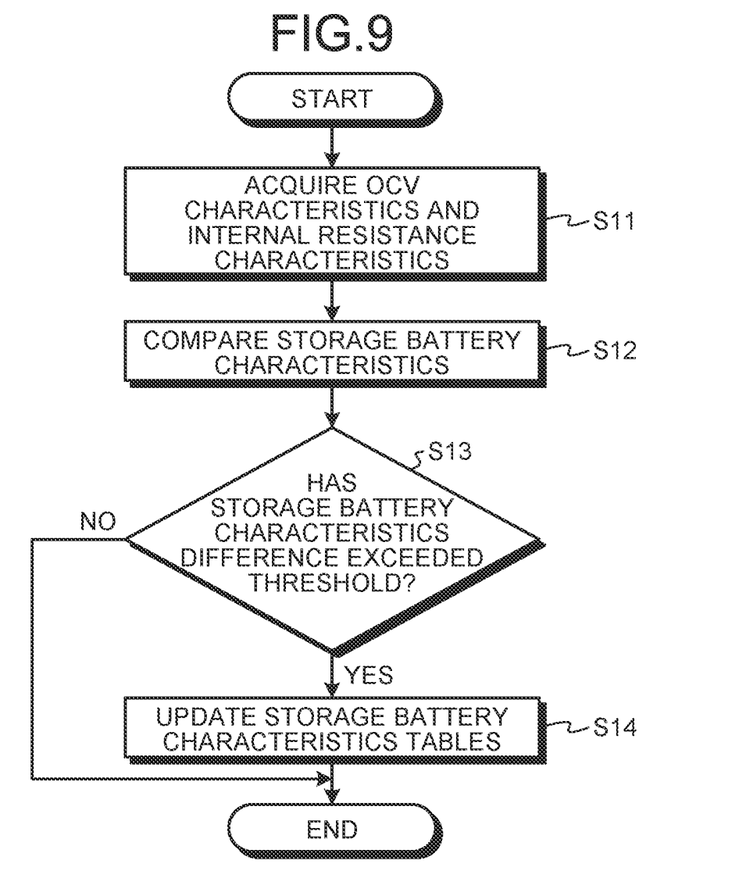
FIG. 9 is a processing flowchart in the fourth embodiment.

FIG. 9 is a processing flowchart in the fourth embodiment.

First, the OCV characteristics acquisition unit 21 acquires OCV characteristics based on storage battery information BTI such as voltage, current, and temperature output from the storage battery unit 11, and outputs the OCV characteristics to the storage battery characteristics update determination unit 35, and the internal resistance characteristics acquisition unit 26 acquires internal resistance characteristics based on the storage battery information BTI, and outputs the internal resistance characteristics to the storage battery characteristics update determination unit 35 (Step S11).

The storage battery characteristics update determination unit 35 compares the present storage battery characteristics including full charge capacity, which is acquired from the OCV characteristics acquisition unit 21 and the internal resistance characteristics acquisition unit 26, with storage battery characteristics corresponding to the storage battery characteristics table (OCV characteristics table) TB1 and the storage battery characteristics table (internal resistance characteristics table) TB2 stored in the storage battery characteristics storage unit 22 (Step S12), and determines whether a change amount thereof deviates from a predetermined allowable range. The storage battery characteristics update determination unit 35 determines whether the present full charge capacity has exceeded a prescribed threshold (Step S13).

When the change amount obtained by comparing the present storage battery characteristics with the storage battery characteristics stored in the storage battery characteristics storage unit 22 deviates from a predetermined allowable range or when the present full charge capacity has exceeded a prescribed threshold (Yes at Step S13), the storage battery characteristics update determination unit 35 determines to update the storage battery characteristics tables TB1 and TB2.

As a result, the storage battery characteristics update unit 36 updates the storage battery characteristics tables TB1 and TB2 (Step S14).

On the other hand, when the change amount obtained by comparing the present storage battery characteristics with the storage battery characteristics stored in the storage battery characteristics storage unit 22 is within the predetermined allowable range and when the present full charge capacity is equal to or less than the prescribed threshold (No at Step S13), the storage battery characteristics update determination unit 35 determines to maintain the storage battery characteristics tables TB1 and TB2 without any change, and finishes the processing.

Thus, when the change amount obtained by comparing the present storage battery characteristics with the storage battery characteristics stored in the storage battery characteristics storage unit 22 is within an allowable range and when the present full charge capacity is equal to or less than a prescribed threshold, the storage battery characteristics tables TB1 and TB2 are not updated because the storage battery characteristics tables TB1 and TB2 at that time point do not deviate from substantial storage battery characteristics. Consequently, the impair of stability of storage battery system operation due to discontinuous control reference can be avoided.

Furthermore, when the storage battery characteristics tables TB1 and TB2 need to be updated, the storage battery characteristics tables TB1 and TB2 can be reliably updated, and by using the updated storage battery characteristics tables TB1 and TB2, SOC can be more accurately estimated even if the storage battery cell 33 deteriorates.

[5] Fifth Embodiment

In each of the above-mentioned embodiments, the storage battery system automatically updates the storage battery characteristics tables, but the present embodiment is an embodiment in which storage battery information BTI such as current information, voltage information, and temperature information output from the storage battery system is remotely collected, and the present storage battery characteristics are presented to a user (operator), thereby determining whether to update the storage battery characteristics tables, and updating the storage battery characteristics table when an update instruction is made.

Figure 10:
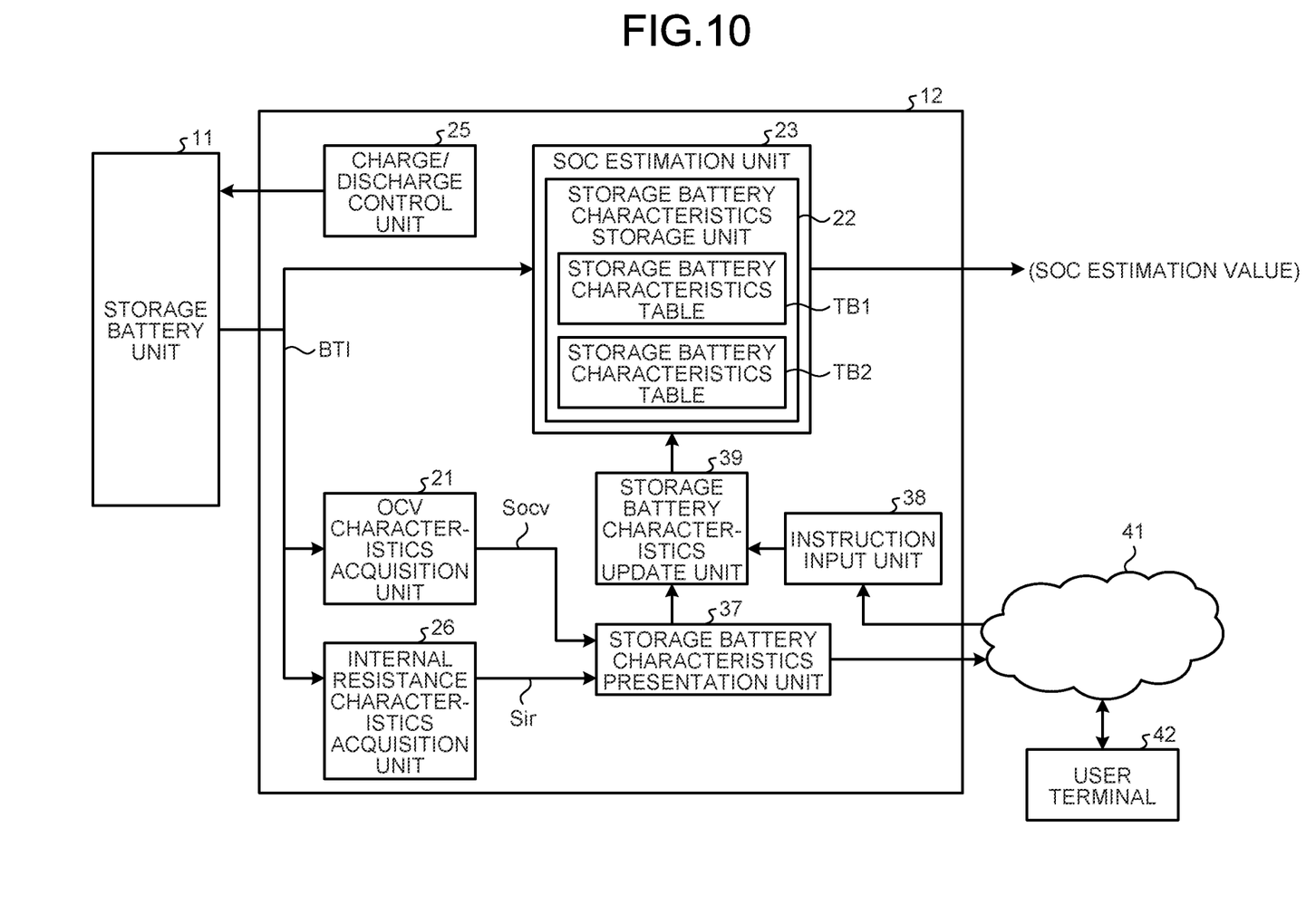
FIG. 10 is a main schematic configuration block diagram of a storage battery system in a fifth embodiment.

FIG. 10 is a main schematic configuration block diagram of a storage battery system in the fifth embodiment.

In FIG. 10, the same parts as in FIG. 8 are denoted by the same reference symbols.

The fifth embodiment is different from the fourth embodiment in FIG. 8 in that the storage battery system includes a storage battery characteristics presentation unit 37 for presenting the present storage battery characteristics including full charge capacity, which are acquired from the OCV characteristics acquisition unit 21 and the internal resistance characteristics acquisition unit 26, to a user terminal 42 communicably connected through a network 41, an instruction input unit 38 for receiving input of an update instruction input from the user terminal 42 through the network 41, and a storage battery characteristics update unit 39 that functions as a characteristics update unit and updates a storage battery characteristics table based on the update instruction from the user terminal 42 input through the instruction input unit 38.

Figure 11:
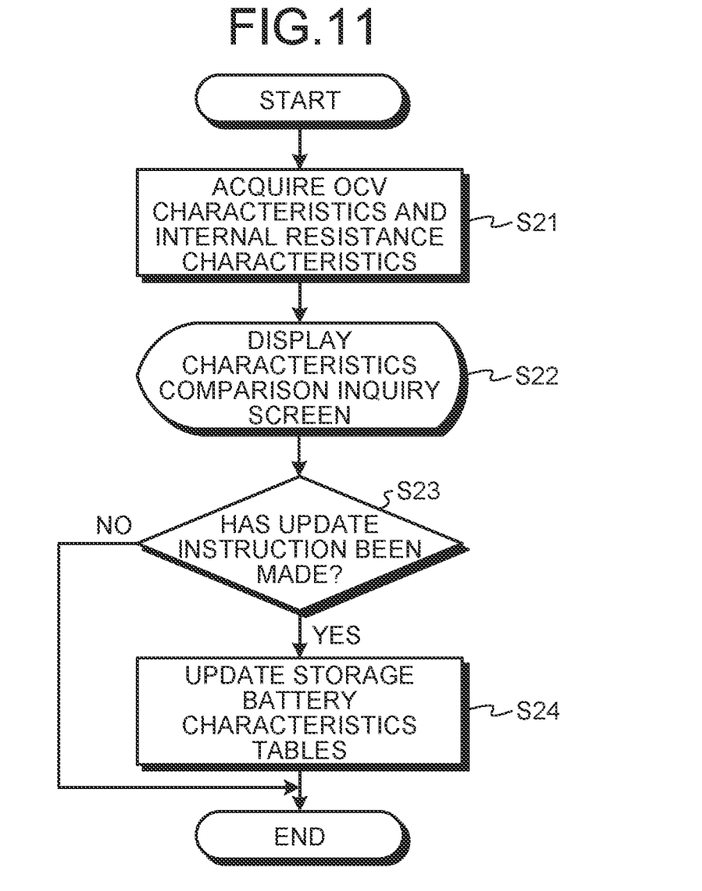
FIG. 11 is a processing flowchart in the fifth embodiment.

FIG. 11 is a processing flowchart in the fifth embodiment.

First, the OCV characteristics acquisition unit 21 acquires OCV characteristics based on storage battery information BTI such as current information, voltage information, and temperature information output from the storage battery unit 11, and outputs the OCV characteristics to the storage battery characteristics presentation unit 37, and the internal resistance characteristics acquisition unit 26 acquires internal resistance characteristics based on the storage battery information BTI, and outputs the internal resistance characteristics to the storage battery characteristics presentation unit 37 (Step S21).

The storage battery characteristics presentation unit 37 presents the present storage battery characteristics including full charge capacity, which are acquired from the OCV characteristics acquisition unit 21 and the internal resistance characteristics acquisition unit 26, to the user terminal 42 communicably connected through the network 41.

In this manner, a characteristics comparison inquiry screen for prompting input as to whether to update storage battery characteristics corresponding to the storage battery characteristics table (OCV characteristics table) TB1 and the storage battery characteristics table (internal resistance characteristics table) TB2 stored in the storage battery characteristics storage unit 22 is displayed on a display screen of the user terminal 42 (Step S22).

Thus, a user of the user terminal 42 makes determination based on the displayed characteristics comparison inquiry screen.

Figure 12A:
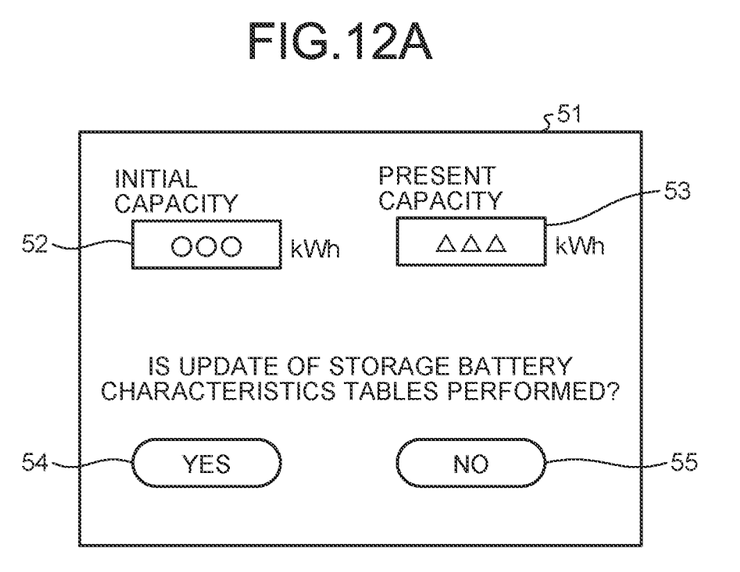
FIGS. 12A and 12B are explanatory diagrams of an example of a characteristics comparison inquiry screen.
Figure 12B:
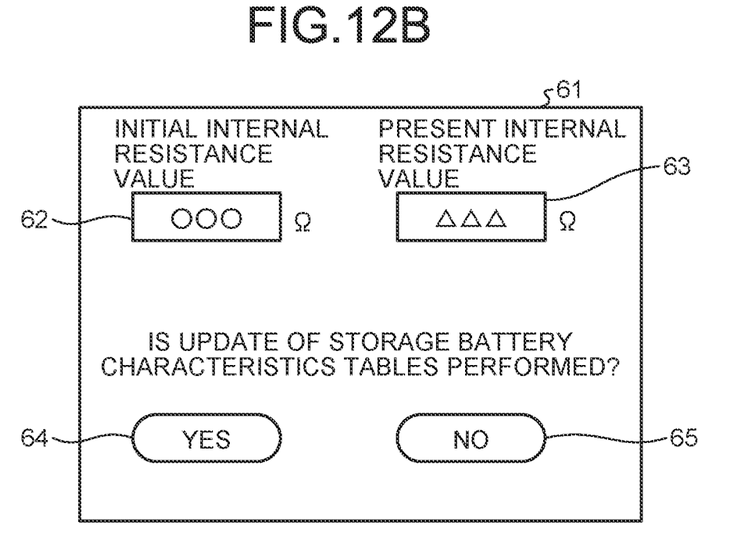

FIGS. 12A and 12B are explanatory diagrams of an example of the characteristics comparison inquiry screen.

FIG. 12A is an example of the characteristics comparison inquiry screen on which characteristics are compared and inquired about the capacity of the storage battery as storage battery characteristics.

A characteristics comparison inquiry screen 51 displayed on the display screen of the user terminal 42 includes an initial capacity display portion 52 for displaying initial capacity of the storage battery system 10, a present capacity display portion 53 for displaying the present capacity, an update instruction button 54 for instructing the updating of the storage battery characteristics tables TB1 and TB2, and a non-update instruction button 55 for avoiding (canceling) instructing the updating of the storage battery characteristics tables TB1 and TB2.

Thus, when a user compares the initial capacity of the storage battery system 10 displayed on the initial capacity display portion 52 with the present capacity of the storage battery system 10 displayed on the present capacity display portion 53, and determines that the storage battery characteristics tables TB1 and TB2 need to be updated, the user operates the update instruction button 54 (in the case of a touch panel, the user performs touch operation, and in the case of a display, the user performs operation with a pointing device) to make an update instruction as instruction input to the storage battery characteristics update unit 39 through the network 41 and the instruction input unit 38.

In this manner, the storage battery characteristics update unit 39 determines whether the update instruction has been made (Step S23), determines that the update instruction has been made (Yes at Step S23), and updates the storage battery characteristics tables TB1 and TB2 (Step S24).

On the other hand, when the user compares the initial capacity of the storage battery system 10 displayed on the initial capacity display portion 52 with the present capacity of the storage battery system 10 displayed on the present capacity display portion 53, and determines that the storage battery characteristics tables TB1 and TB2 do not need to be updated, the user operates the non-update instruction button 55 to make an non-update instruction as instruction input to the storage battery characteristics update unit 36 through the network 41 and the instruction input unit 38.

In this manner, the storage battery characteristics update unit 39 determines whether the update instruction has been made (Step S23), determines that the update instruction has not been made (No at Step S23), and maintains the storage battery characteristics tables TB1 and TB2.

FIG. 12B is an example of the characteristics comparison inquiry screen on which characteristics are compared and inquired about an internal resistance value as storage battery characteristics.

A characteristics comparison inquiry screen 61 displayed on the display screen of the user terminal 42 includes an initial internal resistance value display portion 62 for displaying an initial internal resistance value of the storage battery system 10, a present internal resistance value display portion 63 for displaying the present internal resistance value, an update instruction button 64 for instructing the updating of the storage battery characteristics tables TB1 and TB2, and a non-update instruction button 65 for avoiding (canceling) instructing the updating of the storage battery characteristics tables TB1 and TB2.

Thus, when a user compares an initial internal resistance value of the storage battery system 10 displayed on the initial internal resistance value display portion 62 with the present internal resistance value of the storage battery system 10 displayed on the present internal resistance value display portion 63, and determines that the storage battery characteristics tables TB1 and TB2 need to be updated, the user operates the update instruction button 64 to make an update instruction as instruction input to the storage battery characteristics update unit 39 through the network 41 and the instruction input unit 38.

In this manner, the storage battery characteristics update unit 39 determines whether the update instruction has been made (Step S23), determines that the update instruction has been made (Yes at Step S23), and updates the storage battery characteristics tables TB1 and TB2 (Step S24).

On the other hand, when the user compares the initial internal resistance value of the storage battery system 10 displayed on the initial internal resistance value display portion 62 with the present internal resistance value of the storage battery system 10 displayed on the present internal resistance value display portion 63, and determines that the storage battery characteristics tables TB1 and TB2 do not need to be updated, the user operates the non-update instruction button 65 to make a non-update instruction as instruction input to the storage battery characteristics update unit 39 through the network 41 and the instruction input unit 38.

In this manner, the storage battery characteristics update unit 39 determines whether the update instruction has been made (Step S23), determines that the update instruction has not been made (No at Step S23), and maintains the storage battery characteristics tables TB1 and TB2.

Thus, when it is determined that the updating of the storage battery characteristics tables TB1 and TB2 is preferred in terms of operation of the storage battery system, the user can update the storage battery characteristics tables TB1 and TB2, and the impair of stability of storage battery system operation due to discontinuous control reference can be avoided.

Furthermore, when the storage battery characteristics tables TB1 and TB2 need to be updated, the storage battery characteristics tables TB1 and TB2 can be reliably updated, and by using the updated storage battery characteristics tables TB1 and TB2, SOC can be more accurately estimated even if the storage battery cell 33 deteriorates.

Furthermore, even when the user is located at a distance from an installation site of the storage battery system 10, the user can grasp the present storage battery characteristics, and execute the updating of the storage battery characteristics tables at a more reliable timing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A storage battery management device comprising:
a memory configured to store therein storage battery characteristics of a storage battery unit as a storage battery characteristics table;
one or more processors coupled to the memory and configured to:
acquire, based on storage battery information including charge voltage characteristics, discharge voltage characteristics, and temperature of the storage battery unit output from the storage battery unit in a charge period from a completely discharged state to a fully charged state and in a discharge period from the fully charged state to the completely discharged state, storage battery characteristics with respect to change in SOC (State of Charge) at the temperature;
update the storage battery characteristics table over an entire range based on the acquired storage battery characteristics; and
estimate SOC of the storage battery unit by referring to the updated storage battery characteristics table,
wherein the storage battery characteristics include OCV (Open Circuit Voltage) characteristics with respect to change in SOC and temperature, and
the storage battery characteristics table is an OCV characteristics table.

2. The storage battery management device according to claim 1, wherein
the one or more processors are configured to:
determine whether the storage battery characteristics table needs to be updated based on the acquired storage battery characteristics; and
update the storage battery characteristics table when it is determined that the storage battery characteristics table needs to be updated based on a determination result.

3. The storage battery management device according to claim 2, wherein
the storage battery information includes information on full charge capacity, and
the one or more processors are configured to determine that the storage battery characteristics table needs to be updated when present full charge capacity is smaller than a prescribed value.

4. The storage battery management device according to claim 1, wherein the one or more processors are configured to:
present the acquired storage battery characteristics to a user terminal connected through a network;
receive input of an update instruction for the storage battery characteristics table; and
update the storage battery characteristics table when the update instruction is input.

5. The storage battery management device according to claim 4, wherein the one or more processors are configured to:
receive input of the update instruction from the user terminal through the network.

6. The storage battery management device according to claim 1, wherein the storage battery characteristics include full charge capacity.

7. The storage battery management device according to claim 1, wherein the storage battery information includes current, voltage, and temperature of the storage battery unit.

8. A storage battery management device comprising:
a memory configured to store therein storage battery characteristics of a storage battery unit as a storage battery characteristics table; and one or more processors coupled to the memory and configured to:

acquire, based on storage battery information including charge voltage characteristics, discharge voltage characteristics, and temperature of the storage battery unit output from the storage battery unit in a charge period from a completely discharged state to a fully charged state and in a discharge period from the fully charged state to the completely discharged state, storage battery characteristics with respect to change in SOC (State of Charge) at the temperature;

update the storage battery characteristics table over an entire range based on the acquired storage battery characteristics; and estimate SOC of the storage battery unit by referring to the updated storage battery characteristics table, wherein the storage battery characteristics include internal resistance characteristics with respect to change in SOC and temperature, and the storage battery characteristics table is an internal resistance characteristics table.

9. A method to be executed by a storage battery management device including a characteristics storage unit configured to store therein storage battery characteristics of a storage battery unit as a storage battery characteristics table, the method comprising:

acquiring, based on storage battery information including charge voltage characteristics, discharge voltage characteristics, and temperature of the storage battery unit output from the storage battery unit in a charge period from a completely discharged state to a fully charged state and in a discharge period from the fully charged state to the completely discharged state, storage battery characteristics with respect to change in SOC (State of Charge) at the temperature;

updating the storage battery characteristics table over an entire range based on the acquired storage battery characteristics; and estimating SOC of the storage battery unit by referring to the updated storage battery characteristics table, wherein the storage battery characteristics include OCV (Open Circuit Voltage) characteristics with respect to change in SOC and temperature, and the storage battery characteristics table is an OCV characteristics table.

10. The method according to claim 9, comprising determining whether the storage battery characteristics table needs to be updated based on the storage battery characteristics acquired at the acquiring the storage battery characteristics, wherein the updating the storage battery characteristics table includes updating the storage battery characteristics table when it is determined, based on a determination result as to whether the storage battery characteristics table needs to be updated, that the storage battery characteristics table needs to be updated.

11. The method according to claim 10, wherein the storage battery information includes information on full charge capacity, and the determining whether the storage battery characteristics table needs to be updated includes determining that the storage battery characteristics table needs to be updated when present full charge capacity is smaller than a prescribed value.

12. The method according to claim 9, comprising:

presenting the storage battery characteristics acquired at the acquiring the storage battery characteristics; and receiving input of an update instruction for the storage battery characteristics table, wherein the updating the storage battery characteristics table includes updating the storage battery characteristics table when the update instruction is input.

13. The method according to claim 12, wherein the presenting the storage battery characteristics includes presenting the storage battery characteristics to a user terminal connected through a network, and the receiving input of the update instruction includes receiving input of the update instruction from the user terminal through the network.

* * * * *